(12) United States Patent
Chao et al.

(10) Patent No.: US 10,937,495 B2
(45) Date of Patent: Mar. 2, 2021

(54) RESISTIVE MEMORY APPARATUS AND METHOD FOR WRITING DATA THEREOF

(71) Applicant: Winbond Electronics Corp., Taichung (TW)

(72) Inventors: He-Hsuan Chao, Taichung (TW); Ping-Kun Wang, Taichung (TW); Seow Fong Lim, San Jose, CA (US); Norio Hattori, Kanagawa (JP); Chien-Min Wu, Taichung (TW); Chih-Hua Hung, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/460,995

(22) Filed: Jul. 2, 2019

(65) Prior Publication Data

US 2021/0005255 A1 Jan. 7, 2021

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0064* (2013.01); *G11C 13/0097* (2013.01); *G11C 2013/0066* (2013.01); *G11C 2013/0076* (2013.01)

(58) Field of Classification Search
CPC .............. G11C 13/0069; G11C 13/004; G11C 13/0096; G11C 2013/0066; G11C 2013/0076
See application file for complete search history.

(56) References Cited

U.S. PATENT DOCUMENTS

| | | | |
|---|---|---|---|
| 6,963,501 | B2 | 11/2005 | Shiga |
| 7,542,356 | B2 | 6/2009 | Lee et al. |
| 7,996,634 | B2 | 8/2011 | Tanaka |
| 8,040,730 | B2 | 10/2011 | Takehara et al. |
| 8,804,429 | B2 | 8/2014 | Van Tran et al. |
| 9,202,548 | B2 | 12/2015 | Faber |

(Continued)

FOREIGN PATENT DOCUMENTS

| | | |
|---|---|---|
| JP | H04184795 | 7/1992 |
| JP | 2014026712 | 2/2014 |

(Continued)

OTHER PUBLICATIONS

Jinwook Jung, et al., "Energy-Efficient Spin-Transfer Torque RAM Cache Exploiting Additional All-Zero-Data Flags", 14th International Symposium on Quality Electronic Design (ISQED), Mar. 4-6, 2013, pp. 1-7.

(Continued)

*Primary Examiner* — Toan K Le
(74) *Attorney, Agent, or Firm* — JCIPRNET

(57) ABSTRACT

A resistive memory and a method for writing data thereof are provided. The method for writing data includes: receiving a write-in data and generating an inverted write-in data; reading a current data in a plurality of selected memory cells; comparing the current data with the write-in data and the inverted write-in data; selecting the write-in data or the inverted write-in data to generate a final data according to a comparison result; and writing the final data into the selected memory cells.

25 Claims, 17 Drawing Sheets

(56) References Cited

U.S. PATENT DOCUMENTS

| | | | |
|---|---|---|---|
| 2008/0101131 A1* | 5/2008 | Lee | G11C 13/0004 |
| | | | 365/189.07 |
| 2009/0040997 A1 | 2/2009 | Oh et al. | |
| 2013/0212431 A1* | 8/2013 | Ong | G06F 21/00 |
| | | | 714/15 |
| 2014/0157065 A1* | 6/2014 | Ong | G06F 15/7821 |
| | | | 714/718 |
| 2017/0255384 A1 | 9/2017 | Hashimoto et al. | |
| 2018/0076828 A1 | 3/2018 | Kanno | |
| 2018/0173421 A1 | 6/2018 | Sela et al. | |
| 2019/0164604 A1* | 5/2019 | Jeong | G11C 7/1006 |
| 2019/0164605 A1* | 5/2019 | Jeong | G06F 1/28 |
| 2020/0104504 A1 | 4/2020 | Chaiken et al. | |
| 2020/0183784 A1* | 6/2020 | Shin | G06F 3/0679 |

FOREIGN PATENT DOCUMENTS

| | | |
|---|---|---|
| JP | 2018147542 | 9/2018 |
| KR | 100827702 | 5/2008 |

OTHER PUBLICATIONS

"Office Action of Korea Counterpart Application" with English translation thereof, dated Apr. 14, 2020, p. 1-p. 10.

"Office Action of U.S. Appl. No. 16/551,752", dated May 20, 2020, pp. 1-12.

"Office Action of Taiwan Counterpart Application", dated Jul. 14, 2020, p. 1-p. 5.

"Office Action of Japan Counterpart Application", dated Oct. 20, 2020, p. 1-p. 5.

\* cited by examiner

| | | Byte | | | | | | | | DFB | PSB | The number of bits changed | | Tdata | |
|---|---|---|---|---|---|---|---|---|---|---|---|---|---|---|---|
| | | | | | | | | | | | | 0→1 | 1→0 | | |
| | Udata=#00 | 0 | 0 | 0 | 0 | 0 | 0 | 0 | 0 | | | | | | |
| | Odata=#F9 | 1 | 1 | 1 | 1 | 1 | 0 | 0 | 1 | x | 0/1 | | | | |
| Mode I (PSB=0) | Tdata | 0 | 0 | 0 | 0 | 0 | 0 | 0 | 0 | 0 | 0 | 0 | 6 | 6 | |
| | /Tdata | 1 | 1 | 1 | 1 | 1 | 1 | 1 | 1 | 1 | 0 | 2 | 0 | 2 | →Selected as Fdata |
| Mode II (PSB=1) | Tdata | 0 | 0 | 0 | 0 | 0 | 0 | 0 | 0 | 0 | 1 | 0 | 6 | 6 | →Selected as Fdata |
| | /Tdata | 1 | 1 | 1 | 1 | 1 | 1 | 1 | 1 | 1 | 1 | 2 | 0 | 2 | |

FIG. 4A

| | | Byte | | | | | | | | DFB | PSB | The number of bits changed | | Tdata | |
|---|---|---|---|---|---|---|---|---|---|---|---|---|---|---|---|
| | | | | | | | | | | | | 0→1 | 1→0 | | |
| | Udata=#FF | 1 | 1 | 1 | 1 | 1 | 1 | 1 | 1 | | | | | | |
| | Odata=#F9 | 1 | 1 | 1 | 1 | 1 | 0 | 0 | 1 | x | 0/1 | | | | |
| Mode I (PSB=0) | Tdata | 1 | 1 | 1 | 1 | 1 | 1 | 1 | 1 | 0 | 0 | 2 | 0 | 2 | →Selected as Fdata |
| | /Tdata | 0 | 0 | 0 | 0 | 0 | 0 | 0 | 0 | 1 | 0 | 0 | 6 | 6 | |
| Mode II (PSB=1) | Tdata | 1 | 1 | 1 | 1 | 1 | 1 | 1 | 1 | 0 | 1 | 2 | 0 | 2 | |
| | /Tdata | 0 | 0 | 0 | 0 | 0 | 0 | 0 | 0 | 1 | 1 | 0 | 6 | 6 | →Selected as Fdata |

FIG. 4B

|  |  | Byte | | | | | | | | DFB | PSB | The number of bits changed | | Tdata |  |
| --- | --- | --- | --- | --- | --- | --- | --- | --- | --- | --- | --- | --- | --- | --- | --- |
|  |  |  |  |  |  |  |  |  |  |  |  | 0→1 | 1→0 |  |  |
|  | Udata=#03 | 0 | 0 | 0 | 0 | 0 | 0 | 1 | 1 |  |  |  |  |  |  |
|  | Odata=#F9 | 1 | 1 | 1 | 1 | 1 | 0 | 0 | 1 | x | 0/1 |  |  |  |  |
| Mode I (PSB=0) | Tdata | 0 | 0 | 0 | 0 | 0 | 0 | 1 | 0 | 0 | 0 | 1 | 5 | 6 |  |
|  | /Tdata | 1 | 1 | 1 | 1 | 1 | 1 | 0 | 0 | 1 | 0 | 1 | 1 | 2 | →Selected as Fdata |
| Mode II (PSB=1) | Tdata | 0 | 0 | 0 | 0 | 0 | 0 | 1 | 0 | 0 | 1 | 1 | 5 | 6 |  |
|  | /Tdata | 1 | 1 | 1 | 1 | 1 | 1 | 0 | 0 | 1 | 1 | 1 | 1 | 2 | →Selected as Fdata |

FIG. 4C

|  |  | Byte | | | | | | | | DFB | PSB | The number of bits changed | | Tdata |  |
| --- | --- | --- | --- | --- | --- | --- | --- | --- | --- | --- | --- | --- | --- | --- | --- |
|  |  |  |  |  |  |  |  |  |  |  |  | 0→1 | 1→0 |  |  |
|  | Udata=#AA | 1 | 0 | 1 | 0 | 1 | 0 | 1 | 0 |  |  |  |  |  |  |
|  | Odata=#F9 | 1 | 1 | 1 | 1 | 1 | 0 | 0 | 1 | x | 0/1 |  |  |  |  |
| Mode I (PSB=0) | Tdata | 1 | 0 | 1 | 0 | 1 | 0 | 1 | 0 | 0 | 0 | 1 | 3 | 4 | →Selected as Fdata |
|  | /Tdata | 0 | 1 | 0 | 1 | 0 | 1 | 0 | 1 | 1 | 0 | 1 | 3 | 4 |  |
| Mode II (PSB=1) | Tdata | 1 | 0 | 1 | 0 | 1 | 0 | 1 | 0 | 0 | 1 | 1 | 3 | 4 | →Selected as Fdata |
|  | /Tdata | 0 | 1 | 0 | 1 | 0 | 1 | 0 | 1 | 1 | 1 | 1 | 3 | 4 |  |

FIG. 4D

|           | Byte |   |   |   |   |   |   |   | DFB | PSB | SF |
|-----------|---|---|---|---|---|---|---|---|---|---|---|
| Udata=#00 | 0 | 0 | 0 | 0 | 0 | 0 | 0 | 0 |   |   |   |
| Odata=#F9 | x | x | x | x | x | x | x | x | x | x | 0/1 |
| Fdata     | x | x | x | x | x | x | x | x | x | x | 1 |

FIG. 4E

|           | Byte |   |   |   |   |   |   |   | DFB | PSB | SF |
|-----------|---|---|---|---|---|---|---|---|---|---|---|
| Udata=#FF | 1 | 1 | 1 | 1 | 1 | 1 | 1 | 1 |   |   |   |
| Odata=#F9 | x | x | x | x | x | x | x | x | x | x | 0/1 |
| Fdata     | x | x | x | x | x | x | x | x | x | x | 1 |

FIG. 4F

|           | Byte |   |   |   |   |   |   |   | DFB | PSB | SF |
|-----------|---|---|---|---|---|---|---|---|---|---|---|
| Udata=#00 | 0 | 0 | 0 | 0 | 0 | 0 | 0 | 0 |   |   |   |
| Odata=#F9 | x | x | x | x | x | x | x | x | 0/1 | x | 0/1 |
| Fdata     | x | x | x | x | x | x | x | x | 0 | x | 1 |

FIG. 4G

|           | Byte |   |   |   |   |   |   |   | DFB | PSB | SF |
|-----------|---|---|---|---|---|---|---|---|---|---|---|
| Udata=#FF | 1 | 1 | 1 | 1 | 1 | 1 | 1 | 1 |   |   |   |
| Odata=#F9 | x | x | x | x | x | x | x | x | 0/1 | x | 0/1 |
| Fdata     | x | x | x | x | x | x | x | x | 1 | x | 1 |

FIG. 4H

RESISTIVE MEMORY APPARATUS AND METHOD FOR WRITING DATA THEREOF

BACKGROUND OF THE INVENTION

1. Field of the Invention

The invention relates to a resistive memory and a method for writing data thereof, and more particularly, to a resistive memory and a method for writing data thereof that can reduce the number of written bits.

2. Description of Related Art

With advances in semiconductor technology, a variety of memories in different types have been proposed. In recent years, resistive memories that can be used as non-volatile memory media have also been proposed.

In order to improve a cycling endurance for the resistive memories, the conventional technique proposes a resistive memory cell with 2T2R (two-transistor, two-resistor) architecture. Although such resistive memory cell can increase its cycling endurance, a relatively large circuit area is required, resulting in an increase in costs. Therefore, finding a way to complete the design of the resistive memory with both costs and the cycling endurance taken into consideration is an important issue to be addressed in the art.

SUMMARY OF THE INVENTION

The invention provides a resistive memory and a method for writing data thereof that can effectively improve a writing cycling endurance and a writing performance while reducing a power consumption.

A method for writing data of a resistive memory of the invention includes: receiving a write-in data and generating an inverted write-in data; reading a current data in a plurality of selected memory cells; comparing the current data with the write-in data and the inverted write-in data; selecting the write-in data or the inverted write-in data to generate a final data according to a comparison result; and writing the final data into the selected memory cells.

The resistive memory of the invention includes a memory cell array, a controller and a data changing circuit. The controller is coupled to the memory cell array, and configured for: receiving a write-in data and generating an inverted write-in data; reading a current data in a plurality of selected memory cells; comparing the current data with the write-in data and the inverted write-in data; selecting the write-in data or the inverted write-in data to generate a final data according to a comparison result; and writing the final data into the selected memory cells.

Based on the above, in the embodiments of the invention, changes between the write-in data and the current data are determined, and the priority select flag is set according to the determination result. Then, a write-in operation of the write-in data is performed by selecting a mode having a relatively small number of change bits or a relatively small number of reset bits according to the priority select flag. In this way, the number of memory cells on which a write-in action is actually performed may be effectively reduced. As a result, other than reducing the power consumption, the cycling endurance of the memory cells may also be improved to extend a life cycle for the memory cells.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4A to FIG. 4H are schematic diagrams illustrating implementation details of the method for writing data in an embodiment of the invention.

DESCRIPTION OF THE EMBODIMENTS

Figure 1A:
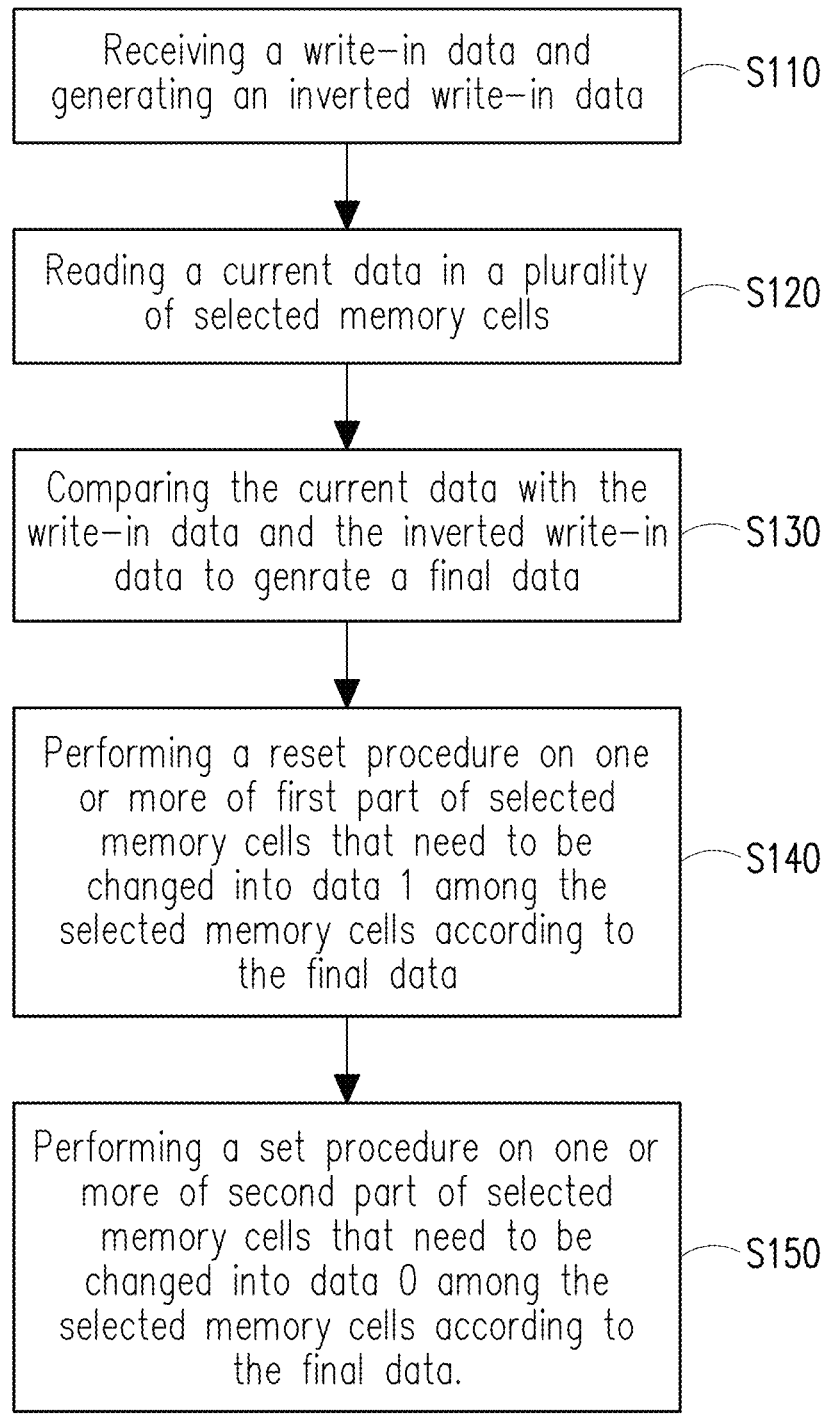
FIG. 1A is a flowchart illustrating a method for writing data of a resistive memory in an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

With reference to FIG. 1A, FIG. 1A is a flowchart illustrating a method for writing data of a resistive memory in an embodiment of the invention. In step S10 of FIG. 1A, a write-in data is received and an inverted write-in data is generated, wherein the inverted write-in data is inverted to the write-in data. Next, in step S120, a current data in a plurality of selected memory cells is read. Here, the selected memory cells are obtained according to write-in address in a write-in action. Specifically, the selected memory cells are memory cells to which data is to be written by said write-in action. In addition, the current data is data originally stored in the selected memory cells.

In step S130, the current data is compared with the write-in data and the inverted write-in data to generate a final data. In an example where the write-in data is 01010000 in binary, the inverted write-in data is 10101111. Again, if the current data in the selected memory cells is 10100000 in binary, in step S130, by comparing the write-in data with the current data bit by bit and comparing the inverted write-in data with the current data bit by bit, the final data may be generated according to a comparison result.

Among the implementations of the invention, the implementation detail for generating the final data may be divided into two modes including a change less mode and a reset less mode. Which of the modes is to be adopted may be decided according to a logic value of a priority select flag. Here, the change less mode may be correspondingly adopted when the priority select flag is a first logic value (e.g., 0), and the reset less mode may be correspondingly adopted when the priority select flag is a second logic value (e.g., 1). In this embodiment, a preset value of the priority select flag is 0. However, the invention is not limited in this regard. The invention may also be also applicable to a different mode (e.g., a set less mode) or may have more than three flag values and other different modes.

In the change less mode, by calculating a first number which represents a difference between bits of the write-in data and the current data and calculating a second number which represents a difference between bits of the inverted write-in data and the current data, the write-in data or the inverted write-in data having the smallest difference may be selected to generate the final data according to sizes of the first number and the second number.

In the reset less mode, the number of bits that need to be reset when changing the current data to the write-in data and the inverted write-in data may be determined, and one of the write-in data or the inverted write-in data having the less number of bits that need to reset may be selected to generate the final data.

In addition, the final data includes a general data, the priority select flag and a data inverting flag. The general data may be the write-in data and the inverted write-in data, and the data inverting flag is configured to indicate that the general data is the write-in data or the inverted write-in data. Here, the data inverting flag may be the first logic value (e.g., 0) when the general data is the write-in data, and the data inverting flag may be the second logic value (e.g., 1) when the general data is the inverted write-in data.

In step S140, a reset procedure is performed on one or more of first part of selected memory cells that need to be changed to data 1 (e.g., logic 1) among the selected memory cells according to the final data. In step S150, a set procedure is performed on one or more of second part of selected memory cells that need to be changed to data 0 (e.g., logic 0) among the selected memory cells according to the final data. In this embodiment, if it is selected to generate the final data according to the write-in data (e.g., equal to 01010000), the reset procedure may be performed on a part (the first part) of the memory cells corresponding to the second and fourth bits of the write-in data (with the highest bit as the first bit) in the selected memory cells, and the set procedure may be performed on a part (the second part) of the memory cells corresponding to the first and third bits of the write-in data (with the highest bit as the first bit) in the selected memory cells. In the invention, the order for performing the reset procedure (step S140) and the set procedure (step S150) is not particularly limited. In other embodiments, the reset procedure may be performed after the set procedure is performed.

Because a certain amount of oxygen ions may be stuck on a connection surface of a conducting filament and an electrode layer of a resistive memory cell after a set operation is performed on the resistive memory, a set current of the resistive memory may not be increased. A recover operation may be performed in the set procedure of the invention after it is verified that the set operation is failed. Said recover operation is used to push the oxygen ions away so the set current of the resistive memory cell can be effectively increased. However, after the recover operation is performed, if it is found that the set current of the resistive memory still cannot be increased or even reduced by detecting the current of the resistive memory, the resistive memory is likely to begin showing show signs of a degradation.

Figure 1B:
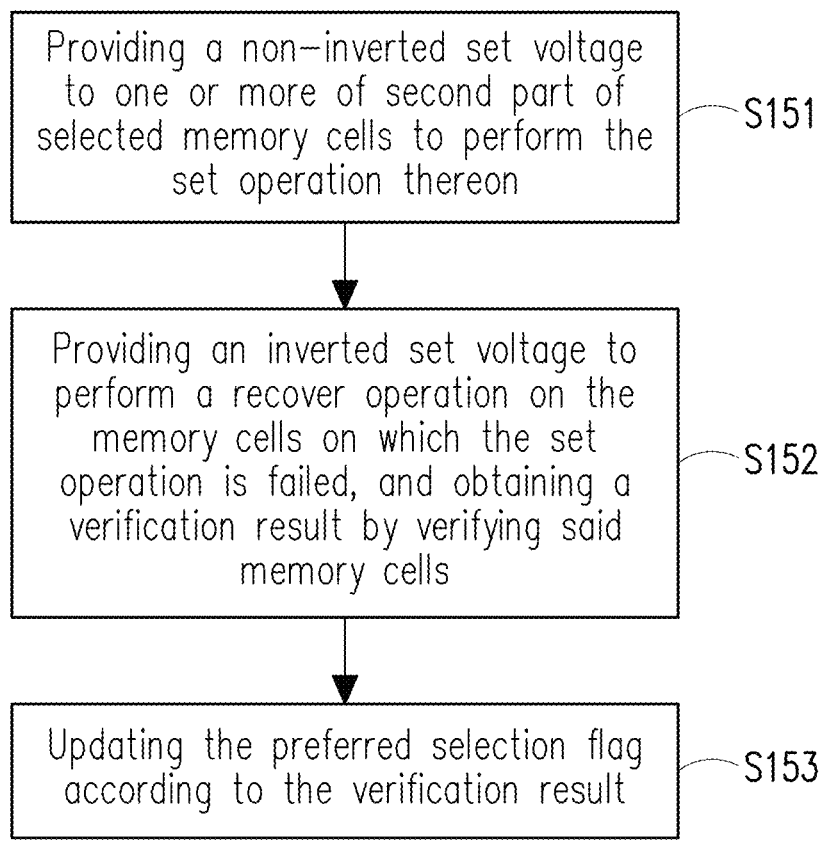
FIG. 1B is a schematic diagram illustrating implementation details of a set procedure.

The following content refers to FIG. 1B, which is a schematic diagram illustrating implementation details of a set procedure. In the set procedure (step S150) of the invention, step S151 to S153 for setting the priority select flag according to a degradation state of the selected memory cells may be optionally included. Specifically, in step S151, a non-inverted set voltage is provided to one or more of second part of selected memory cells to perform the set operation thereon. When the set operation performed on the one or more of second part of selected memory cells is failed, step S152 is performed to provide an inverted set voltage to perform a recover operation on the memory cells on which the set operation is failed and then verify said memory cells to obtain a verification result. If the verification result is a setting failure, which indicates that the selected memory cells have shown the degradation, the priority select flag is updated (e.g., changed to 1) according to the verification result in step S153.

In other embodiments, the priority select flag may also be set directly by users.

Figure 2A:
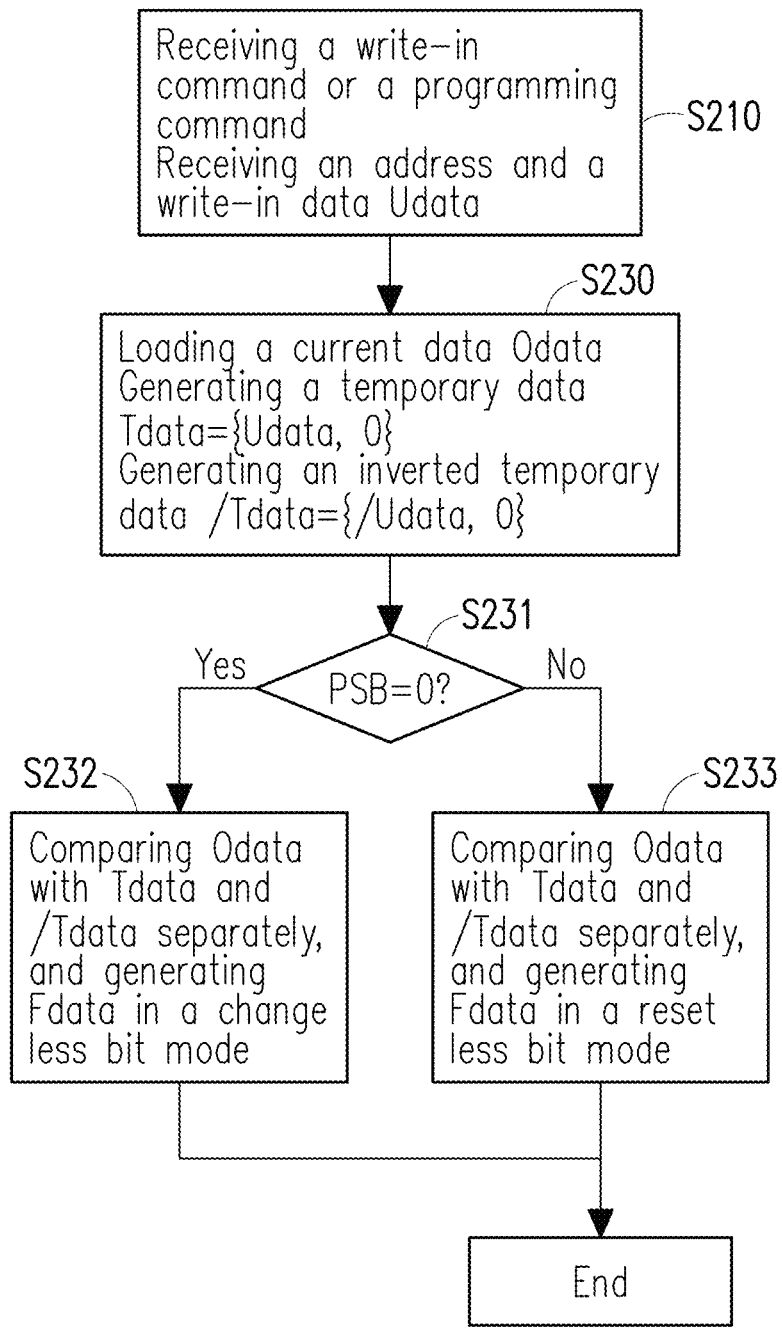
FIG. 2A is a flowchart illustrating an implementation of the method for writing data in an embodiment of the invention.

FIG. 2A is a flowchart illustrating a method for writing data of a resistive memory in an embodiment of the invention. In the method for writing data shown by FIG. 2A, the resistive memory apparatus can operate in a direct write mode or a flash memory compatible mode. Here, a current data Odata stored by selected memory cells include a general data, a data inverting flag DFB and a priority select flag PSB. The data inverting flag DFB is used indicate whether the general data is an inversed data. When the data inverting flag DFB is a first logic value (e.g., 0), the general data is a normal data; conversely, when the data inverting flag DFB is a second logic value (e.g., 1), the general data is the inverted data. In this embodiment, a preset value of the data inverting flag DFB is 0. The priority select flag PSB is used to indicate a data comparison mode that needs to be used when a data writing action is performed on the memory cells corresponding to an address. According to design requirements, users can set the priority select flag PSB to a plurality of logic values for corresponding to multiple data comparison modes. In this embodiment, the priority select flag PSB has two logic values (0 and 1), and a preset value of the priority select flag PSB is 0.

With reference to FIG. 2A, first, a write-in command or a programming command is received and an address and a write-in data Udata are received in step S210. The address above indicates addresses of the selected memory cells to which the data writing action is to be performed.

Next, in step S230, the current data Odata stored by the selected memory cells is loaded, and a temporary data Tdata and an inverted temporary data /Tdata are generated according to the write-in data Udata. Here, the temporary data Tdata={Udata, 0} (0 is the data inverting flag DFB); the inverted temporary data /Tdata={/Udata, 1} (1 is the data inverting flag DFB); and an inverted write-in data /Udata is inverted to the write-in data Udata.

In step S231, a state of the priority select flag PSB in the current data Odata is determined. If the priority select flag PSB has the first logic value (e.g., 0), step S232 is performed. Otherwise, if the priority select flag PSB has the second logic value (e.g., 1), step S233 is performed.

In step S232, the general data in the current data Odata is compared with the write-in data Udata in the temporary data Tdata and the inverted write-in data /Udata in the inverted temporary data /Tdata, and one of the temporary data Tdata and the inverted temporary data /Tdata is selected to generate the final data Fdata through a change less bit mode. Next, the priority select flag PSB (=0) is added to the final data Fdata, and then the final data Fdata is written into the selected memory cells.

In step S233, the general data in the current data Odata is compared with the write-in data Udata in the temporary data Tdata and the inverted write-in data /Udata in the inverted temporary data /Tdata, and one of the temporary data Tdata and the inverted temporary data /Tdata is selected to generate the final data Fdata through a reset less bit mode. Next, the priority select flag PSB (=1) is added to the final data Fdata, and then the final data Fdata is written into the selected memory cells.

It is worth noting that, in an embodiment of the invention, when steps S232 and S233 are performed, an ECC action may be performed on the final data Fdata and the final data Fdata may also include a correspondingly generated error correction code.

Figure 2B:
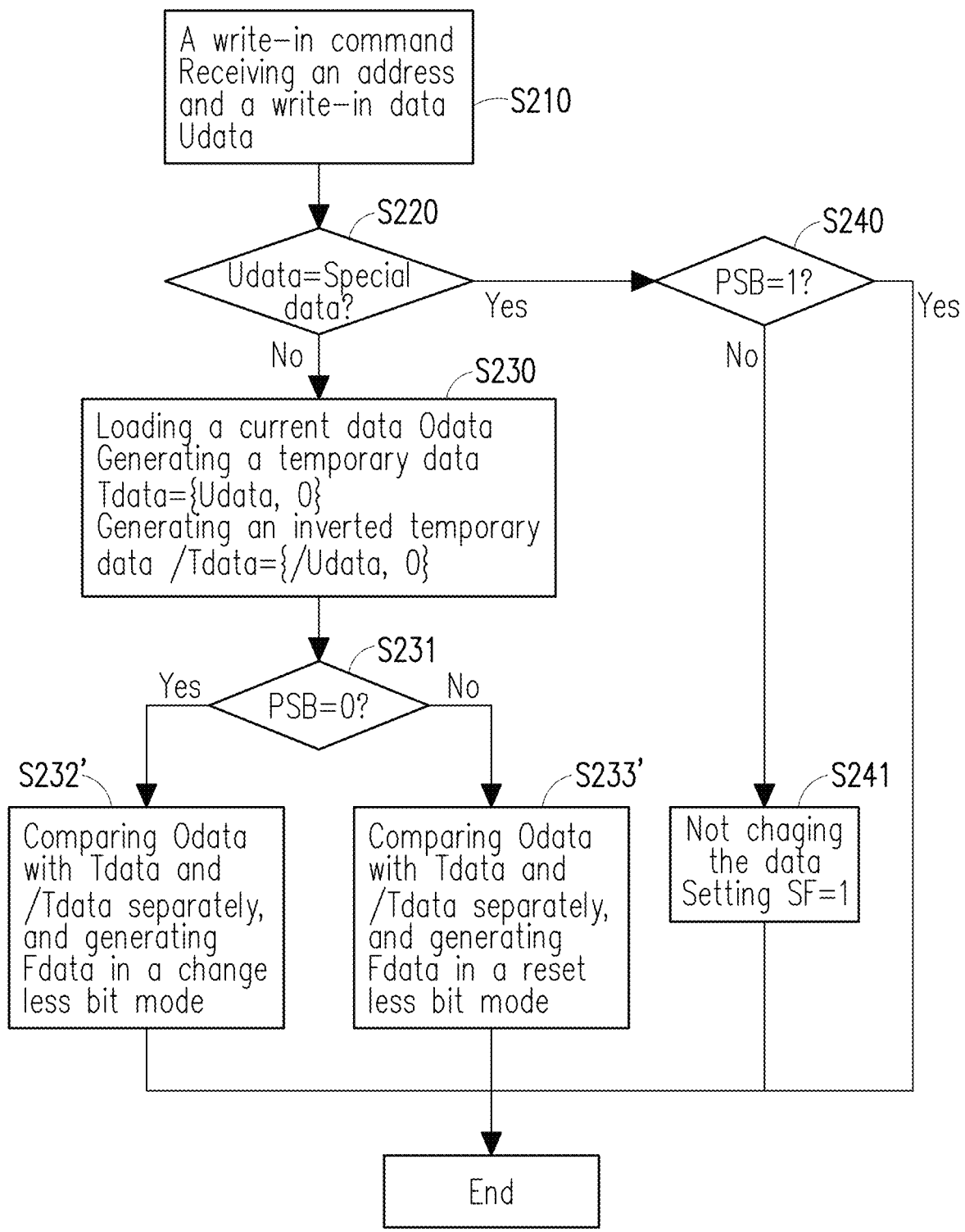
FIG. 2B is a flowchart illustrating another implementation of the method for writing data in an embodiment of the invention.

FIG. 2B is a flowchart illustrating a method for writing data of a resistive memory in another embodiment of the invention. In the method for writing data shown by FIG. 2B, the resistive memory apparatus can operate in the direct write mode. Here, the method for writing data shown by FIG. 2B is substantially similar to that of FIG. 2A and has a major difference in that, a special data flag SF is further included in the current data Odata stored by the selected memory cells in FIG. 2B and step S220 for determining special data and steps S240 to S241 for fast writing are further included. If the special data flag SF is the first logic value (e.g., 0), when the current data Odata is read, the data needs to be read according to the general data and the data inverting flag DFB. Otherwise, if the special data flag SF is the second logic value (e.g., 1), when being read, the current data Odata may directly be read as a special data (e.g., #FF), and the general data and the data inverting flag DFB are ignored.

With reference to FIG. 2B, first, a write-in command is received and an address and a write-in data Udata are received in step S210. The address above indicates addresses of the selected memory cells to which the data writing action is to be performed.

Next, step S220 is performed to determine whether a write-in data Udata is equal to a special data (e.g., #FF in hexadecimal). If a result of above determination is no, steps S230 to S231 and S232' to S233' are performed. Here, steps S230 to S231 are identical to those in the embodiment of FIG. 2A, which are not repeated hereinafter. Steps S232' to S233' are similar to the embodiment of FIG. 2A but different in that, in step S232' to S233' of the present embodiment, the special data flag SF=0 is further added to the final data Fdata, and the final data Fdata is then written into the selected memory cells.

Returning to step S220, if the result of above determination is yes, since the write-in data Udata is identical to the special data, all data in the current data Odata and the final data Fdata may be ignored (X) except the special data flag SF. Instead, it is only required to perform steps S240 to S241 for fast writing in order to determine whether the special data flag SF in the current data needs to be changed to the second logic value (1). In other words, when the current data Odata is read, the general data and the data inverting flag DFB may be ignored and the current data Odata may directly be read as the special data. Specifically, in step S240, whether a state the special data flag SF is 1 in the current data is determined. If yes, there is no need to change the current data Odata and the data writing process is directly ended. If no, step S241 is performed to update only the special data flag SF in the current data Odata to 1 without changing other parts in the current data Odata.

Figure 2C:
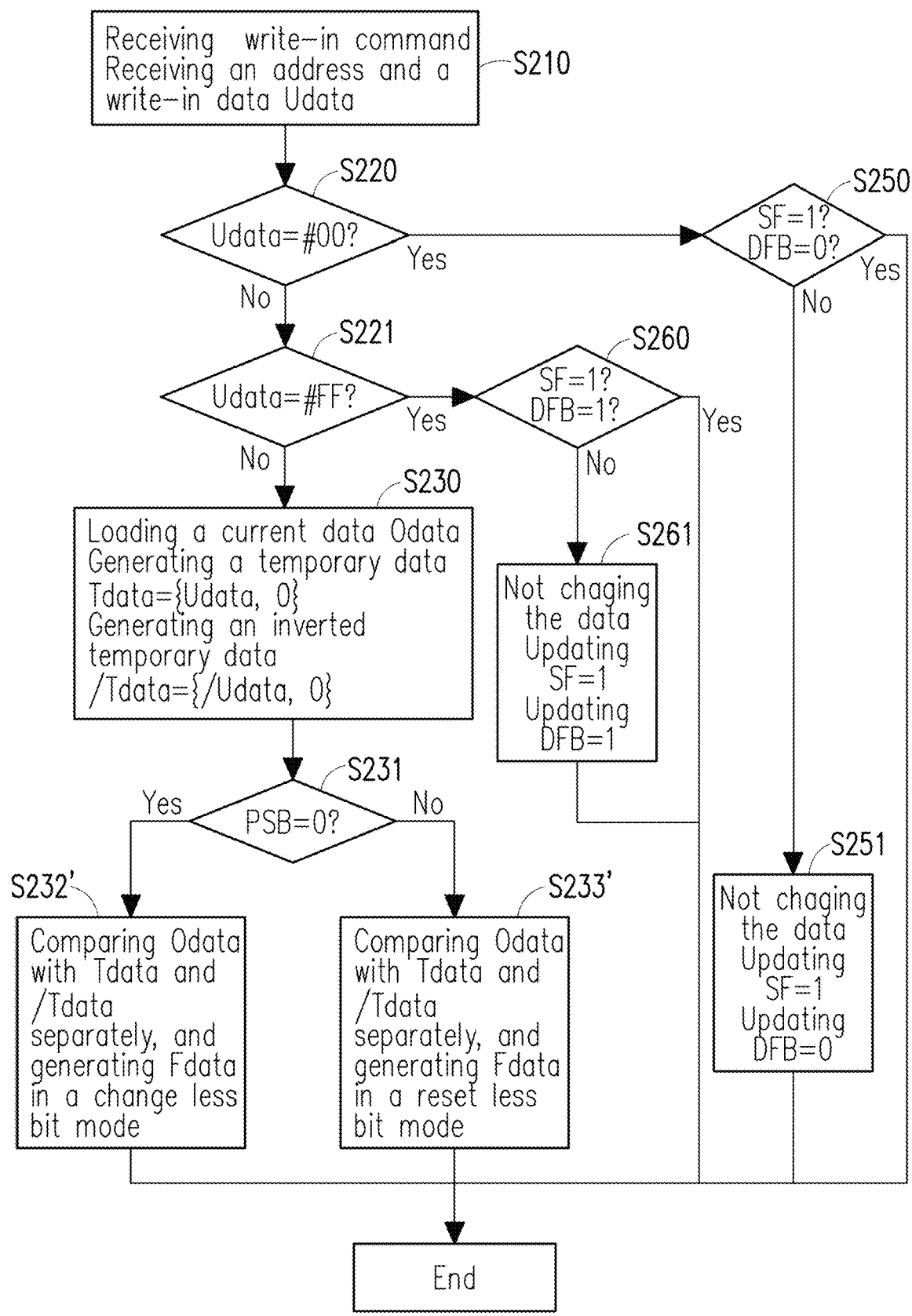
FIG. 2C is a flowchart illustrating another implementation of the method for writing data in an embodiment of the invention.

FIG. 2C is a flowchart illustrating a method for writing data of a resistive memory in another embodiment of the invention. In the method for writing data shown by FIG. 2C, the resistive memory apparatus can operate in a direct write mode. Here, the method for writing data shown by FIG. 2C is substantially similar to that of FIG. 2B and has a major difference in that, the step for determining special data of FIG. 2C includes steps S221 to S222, and the step for fast writing includes steps S250 to S251 and steps S260 to S261. As similar to the embodiment of FIG. 2B, if the special data flag SF is the first logic value (e.g., 0), when the current data Odata is read, the data needs to be read according to the general data and the data inverting flag DFB. However, in this embodiment, if the special data flag SF is the second logic value (1) and the data inverting flag DFB is the first logic value (0), the current data Odata may directly be read as a first special data (e.g., #00 in hexadecimal) with the general data ignored; on the other hand, if the special data flag SF is the second logic value (1) and the data inverting flag DFB is the second logic value (1), the current data Odata may directly be read as a second special data (e.g., #FF in hexadecimal) with the general data ignored.

With reference to FIG. 2C, first, a write-in command is received and an address and a write-in data Udata are received in step S210. The address above indicates addresses of the selected memory cells to which the data writing action is to be performed.

Next, step S221 is performed to determine whether the write-in data Udata is equal to the first special data (e.g., #00 in hexadecimal). If a result of above determination is yes, the steps S250 to S251 for fast writing are performed. In step S250, whether the special data flag SF is 1 and the data inverting flag DFB is 0 in the current data Odata is determined. If yes, there is no need to change the current data Odata and the data writing process is directly ended. If no, step S251 is performed to update the special data flag SF in the current data Odata to 1 and update the data inverting flag DFB to 0 without changing other parts in the current data Odata, and the data writing process is ended.

Returning to step S221, if the write-in data Udata is not equal to the first special data, step S222 is further performed to determine whether the write-in data Udata is equal to the second special data (e.g., #FF in hexadecimal). If a result of above determination is yes, the steps S260 to S261 for fast writing are performed. If the result of above determination is no, steps S230 to S231 and S232' to S233' are performed. Here, steps S230 to S231 and S232' to S233' are identical to those in the embodiment of FIG. 2B, which are not repeated hereinafter.

In step S260, whether the special data flag SF is 1 and the data inverting flag DFB is 1 in the current data Odata is determined. If yes, there is no need to change the current data Odata and the data writing process is directly ended. If no, step S261 is performed to update the special data flag SF in the current data Odata to 1 and update the data inverting flag DFB to 1 without changing other parts in the current data Odata, and the data writing process is ended.

Figure 3:
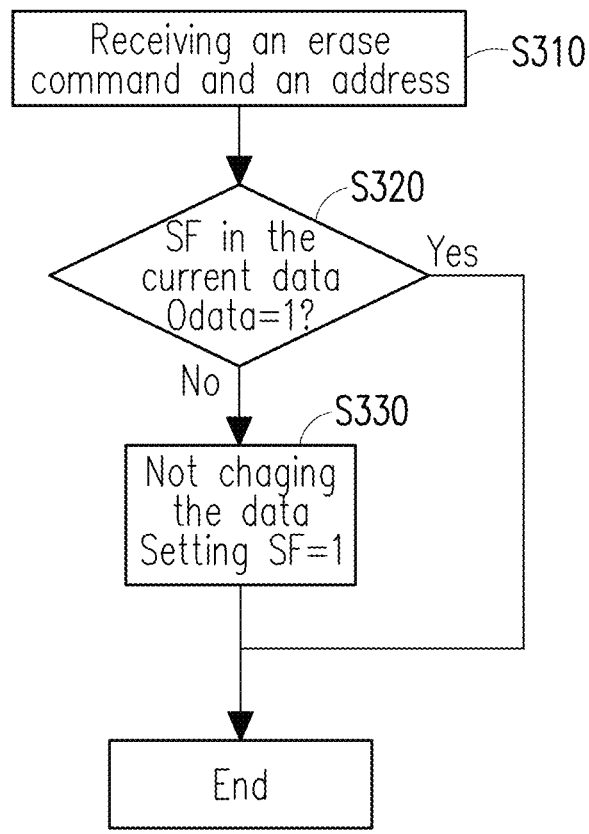
FIG. 3 is a flowchart illustrating another implementation of the method for writing data in an embodiment of the invention.

With reference to FIG. 3, FIG. 3 is a flowchart illustrating a method for writing data of a resistive memory in another embodiment of the invention. In the method for writing data shown by FIG. 3, the resistive memory apparatus can operate in the flash memory compatible mode. In this embodiment, the resistive memory can perform the data writing action according to an erase command of a flash memory. Here, the current data Odata stored by the selected memory cells of FIG. 3 further includes the special data flag SF. Here, if the special data flag SF is the first logic value (e.g., 0), when the current data Odata is read, the general data in the current data Odata does not need to replaced by #FF in hexadecimal. Here, if the special data flag SF is the first logic value (e.g., 1), when the current data Odata is read, the general data in the current data Odata needs to be replaced by #FF in hexadecimal.

First, in step S310, an erase command and an address are received, and the address indicates addresses of the selected memory cells to which a data erase action is to be performed (i.e., by writing #FF in hexadecimal into all the selected memory cells). In step S320, whether the special data flag SF in the current data Odata is 1 is determined. If yes, there is no need to change the current data Odata and the data writing process is directly ended. If no, step S330 is performed to update only the special data flag SF in the current data Odata to 1 without changing other parts in the current data Odata and then the data writing process is ended.

Multiple practical examples are provided below to further describe the method for writing data of the embodiment of the invention. FIG. 4A to FIG. 4D are schematic diagrams illustrating implementation details of the method for writing data according to FIG. 2A. FIG. 4E to FIG. 4F are schematic diagrams illustrating implementation details of the method for writing data according to FIG. 2B. FIG. 4G to FIG. 4H are schematic diagrams illustrating implementation details of the method for writing data according to FIG. 2C. Here, data in FIG. 4A to FIG. 4H are exemplified by data in hexadecimal.

With reference to FIG. 4A to FIG. 4D, in FIG. 4A, the current data Odata is #F9; the write-in data Udata is #00; the temporary data Tdata and the inverted temporary data /Tdata generated according to the write-in data Udata are #00 and #FF respectively. When the priority select flag PSB read from the current data Odata is 0, by comparing the current data Odata with the temporary data Tdata and the inverted temporary data /Tdata bit by bit in the change less bit mode (Mode I), the resistive memory can obtain the following results. Among the current data Odata and the temporary data Tdata, there are 0 bit changed from 0 to 1 and 6 bits changed from 1 to 0, and a total of the number of bits changed is 6. Among the current data Odata and the inverted temporary data /Tdata, there are 2 bits changed from 0 to 1 and 0 bit changed from 1 to 0, and a total of the number of bits changed is 2. Therefore, based on the principle of change less, the inverted temporary data /Tdata may be selected and added with the data inverting flag DFB=1 and the priority select flag PSB=0 to generate the final data.

When the priority select flag PSB read from the current data Odata is 1, by comparing the current data Odata with the temporary data Tdata and the inverted temporary data /Tdata bit by bit in the reset less bit mode (Mode II), the resistive memory can obtain the following results. Among the current data Odata and the temporary data Tdata, 0 bit needs to be reset (changed from 0 to 1). Among the current data Odata and the inverted temporary data /Tdata, 2 bits need to be reset (changed from 0 to 1). Therefore, based on the principle of reset less, the temporary data Tdata may be selected and added with the data inverting flag DFB=0 and the priority select flag PSB=1 to generate the final data.

In FIG. 4B, the current data Odata is #F9; the write-in data Udata is #FF; the temporary data Tdata and the inverted temporary data /Tdata generated according to the write-in data Udata are #FF and #00 respectively. When the priority select flag PSB read from the current data Odata is 0, by comparing the current data Odata with the temporary data Tdata and the inverted temporary data /Tdata bit by bit in the change less bit mode (Mode I), the resistive memory can obtain the following results. Among the current data Odata and the temporary data Tdata, there are 2 bits changed from 0 to 1 and 0 bit changed from 1 to 0, and a total of the number of bits changed is 2. Among the current data Odata and the inverted temporary data /Tdata, there are 0 bit changed from 0 to 1 and 6 bits changed from 1 to 0, and a total of the number of bits changed is 6. Therefore, based on the principle of change less, the temporary data Tdata may be selected and added with the data inverting flag DFB=0 and the priority select flag PSB=0 to generate the final data.

When the priority select flag PSB read from the current data Odata is 1, by comparing the current data Odata with the temporary data Tdata and the inverted temporary data /Tdata bit by bit in the reset less bit mode (Mode II), the resistive memory can obtain the following results. Among the current data Odata and the temporary data Tdata, 2 bits need to be reset (changed from 0 to 1). Among the current data Odata and the inverted temporary data /Tdata, 0 bit needs to be reset (changed from 0 to 1). Therefore, based on the principle of reset less, the inverted temporary data /Tdata may be selected and added with the data inverting flag DFB=1 and the priority select flag PSB=1 to generate the final data.

In FIG. 4C, the current data Odata is #F9; the write-in data Udata is #03; the temporary data Tdata and the inverted temporary data /Tdata generated according to the write-in data Udata are #03 and #FC respectively. When the priority select flag PSB read from the current data Odata is 0, by comparing the current data Odata with the temporary data Tdata and the inverted temporary data /Tdata bit by bit in the change less bit mode (Mode I), the resistive memory can obtain the following results. Among the current data Odata and the temporary data Tdata, there are 1 bit changed from 0 to 1 and 5 bits changed from 1 to 0, and a total of the number of bits changed is 6. Among the current data Odata and the inverted temporary data /Tdata, there are 1 bit changed from 0 to 1 and 1 bit changed from 1 to 0, and a total of the number of bits changed is 2. Therefore, based on the principle of change less, the inverted temporary data /Tdata may be selected and added with the data inverting flag DFB=1 and the priority select flag PSB=0 to generate the final data.

When the priority select flag PSB read from the current data Odata is 1, by comparing the current data Odata with the temporary data Tdata and the inverted temporary data /Tdata bit by bit in the reset less bit mode (Mode II), the resistive memory can obtain the following results. Among the current data Odata and the temporary data Tdata, 1 bit needs to be reset (changed from 0 to 1). Among the current data Odata and the inverted temporary data /Tdata, 1 bit needs to be reset (changed from 0 to 1). In the case where the bits to be reset are identical, the number of bits changed from 1 to 0 among the current data Odata and the temporary data (which is 5) may be further compared with the number of bits changed from 1 to 0 among the current data Odata and the inverted temporary data /Tdata (which is 1). Therefore, the inverted temporary data /Tdata may be selected and added with the data inverting flag DFB=1 and the priority select flag PSB=1 to generate the final data.

In FIG. 4D, the current data Odata is #F9; the write-in data Udata is #AA; the temporary data Tdata and the inverted temporary data /Tdata generated according to the write-in data Udata are #AA and #55 respectively. When the priority select flag PSB read from the current data Odata is 0, by comparing the current data Odata with the temporary data Tdata and the inverted temporary data /Tdata bit by bit in the change less bit mode (Mode I), the resistive memory can obtain the following results. Among the current data Odata and the temporary data Tdata, there are 1 bit changed from 0 to 1 and 3 bits changed from 1 to 0, and a total of the number of bits changed is 4. Among the current data Odata and the inverted temporary data /Tdata, there are 1 bit changed from 0 to 1 and 3 bits changed from 1 to 0, and a total of the number of bits changed is 4. Therefore, based on the principle of change less, either the inverted temporary data /Tdata or the temporary data Tdata may be selected and added with the corresponding data inverting flag DFB=1 or 0 and the priority select flag PSB=0 to generate the final data.

When the priority select flag PSB read from the current data Odata is 1, by comparing the current data Odata with the temporary data Tdata and the inverted temporary data /Tdata bit by bit in the reset less bit mode (Mode II), the resistive memory can obtain the following results. Among the current data Odata and the temporary data Tdata, 1 bit needs to be reset (changed from 0 to 1). Among the current data Odata and the inverted temporary data /Tdata, 1 bit needs to be reset (changed from 0 to 1). In addition, the number of bits changed from 1 to 0 among the current data Odata and the temporary data Tdata and the number of bits changed from 1 to 0 among the current data Odata and the inverted temporary data /Tdata are both 3. Therefore, either the temporary data Tdata or the inverted temporary data /Tdata may be selected and added with the corresponding data inverting flag DFB=0 or 1 and the priority select flag PSB=1 to generate the final data.

With reference to FIG. 4E and FIG. 4F, as described in the embodiment of FIG. 2B, the current data Odata stored by the selected memory cells further includes the special data flag SF and steps S240 to S241 for fast writing are further included. Therefore, whether the write-in data Udata is identical to the special data is first determined. In the embodiment of FIG. 4E, the special data is #00 and the write-in data Udata is #00, for example. In this case, since the write-in data Udata is identical to the special data, all data in the current data Odata and the final data Fdata may be ignored (X) except the data inverting flag SF. Instead, it is only required to determine whether the special data flag SF in the current data needs to be changed to the second logic value (1). In other words, when the current data Odata is read, the current data Odata may directly be read as the special data (#00) with the general data and the data inverting flag DFB ignored. In this embodiment, if the special data flag SF in the current data Odata is the second logic value (1), the data writing process may be directly ended. If the state of the special data flag SF in the current data Odata is not the second logic value, the final data Fdata may be generated simply by updating the special data flag SF to the second logic value (1).

The embodiment of FIG. 4F is similar to the embodiment of FIG. 4E but different in that, in this embodiment, the special data is #FF and the write-in data Udata is also #FF.

Similarly, since the write-in data Udata is identical to the special data, it is only required determine whether the special data flag SF in the current data needs to be changed to the second logic value (1).

With reference to FIG. 4G and FIG. 4H, as described in the embodiment of FIG. 2C, the current data Odata stored by the selected memory cells further includes the special data flag SF and step S221 to S222 and steps S250 to S251 and S260 to S261 for fast writing are further included. Therefore, whether the write-in data Udata is identical to the first special data (e.g., #00) or the second special data (e.g., #FF) is first determined.

In the embodiment of FIG. 4G, the write-in data Udata is #00. In this case, since the write-in data Udata is identical to the first special data, all data in the current data Odata and the final data Fdata may be ignored (X) except the data inverting flag SF and the data inverting flag DFB. Instead, it is only required to determine whether the special data flag SF needs to be updated to the second logic value (1) and whether the data inverting flag DFB needs to be updated to the first logic value (0) in the current data Odata. In other words, when the current data Odata is read, the current data Odata may directly be read as the first special data with the general data ignored. In this embodiment, if the special data flag SF is the second logic value and the data inverting flag DFB is the first logic value in the current data Odata, the data writing process may be directly ended. If the special data flag SF is not the second logic value or the data inverting flag DFB is not the first logic value in the current data Odata, the final data Fdata may be generated simply by updating the special data flag SF to the second logic value and updating the data inverting flag DFB to the first logic value.

In the embodiment of FIG. 4F, the write-in data Udata is #FF. In this case, since the write-in data Udata is identical to the second special data, all data in the current data Odata and the final data Fdata may be ignored (X) except the data inverting flag SF and the data inverting flag DFB. Instead, it is only required to determine whether the special data flag SF needs to be updated to the second logic value (1) and whether the data inverting flag DFB needs to be updated to the second logic value (1) in the current data Odata.

Figure 5A:
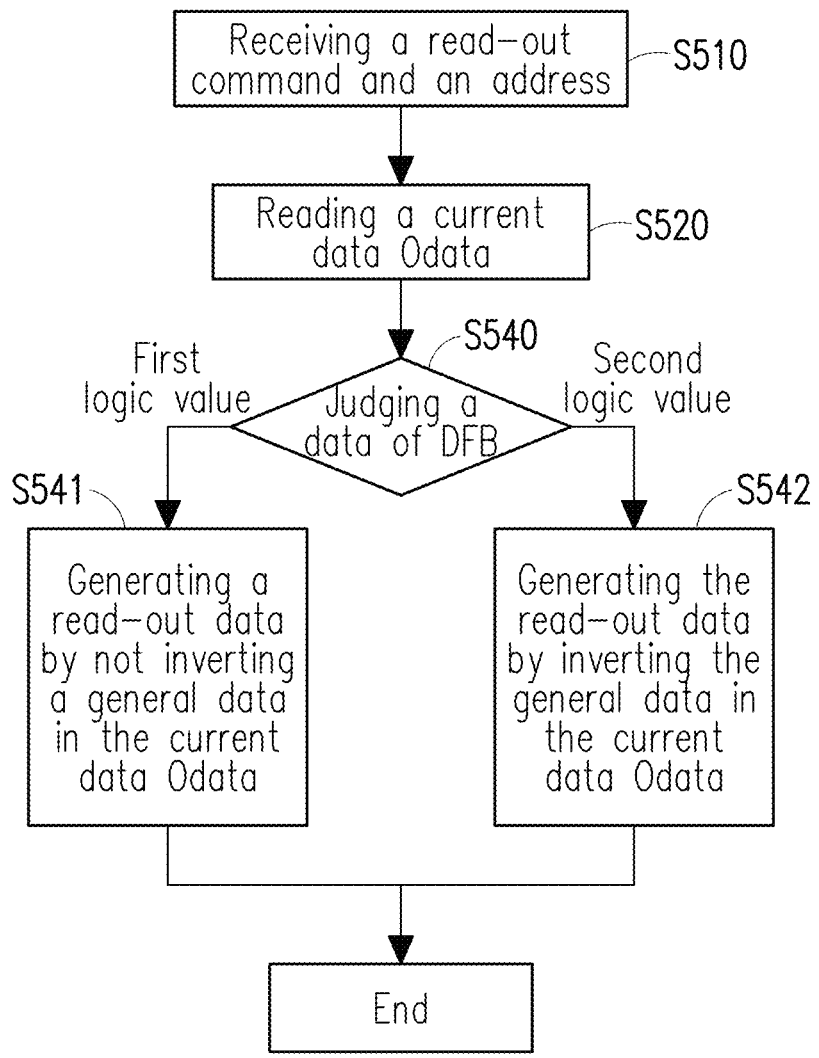
FIG. 5A to FIG. 5C are flowcharts respectively illustrating multiple implementations of a method for reading data in an embodiment of the invention.
Figure 5B:
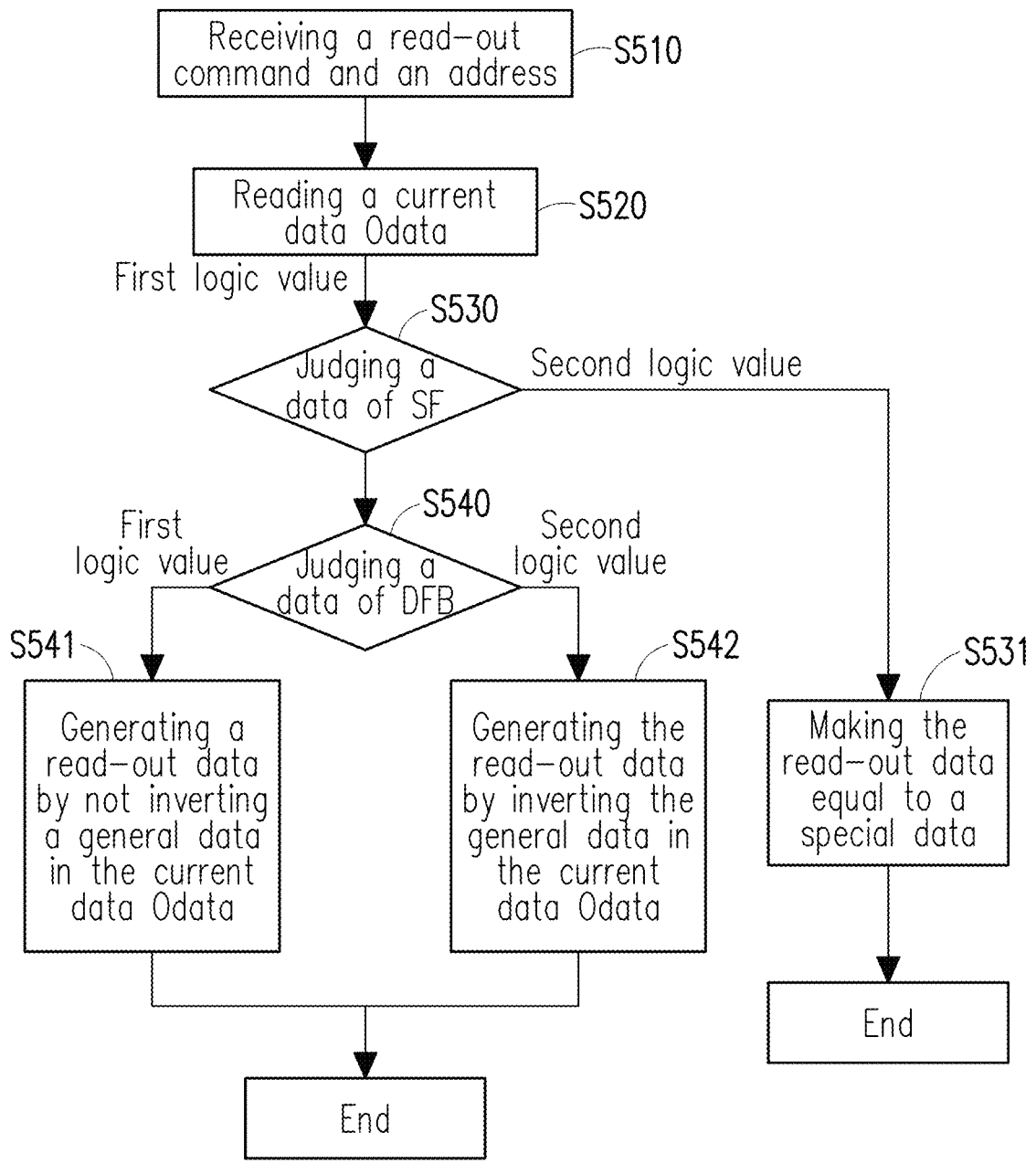
Figure 5C:
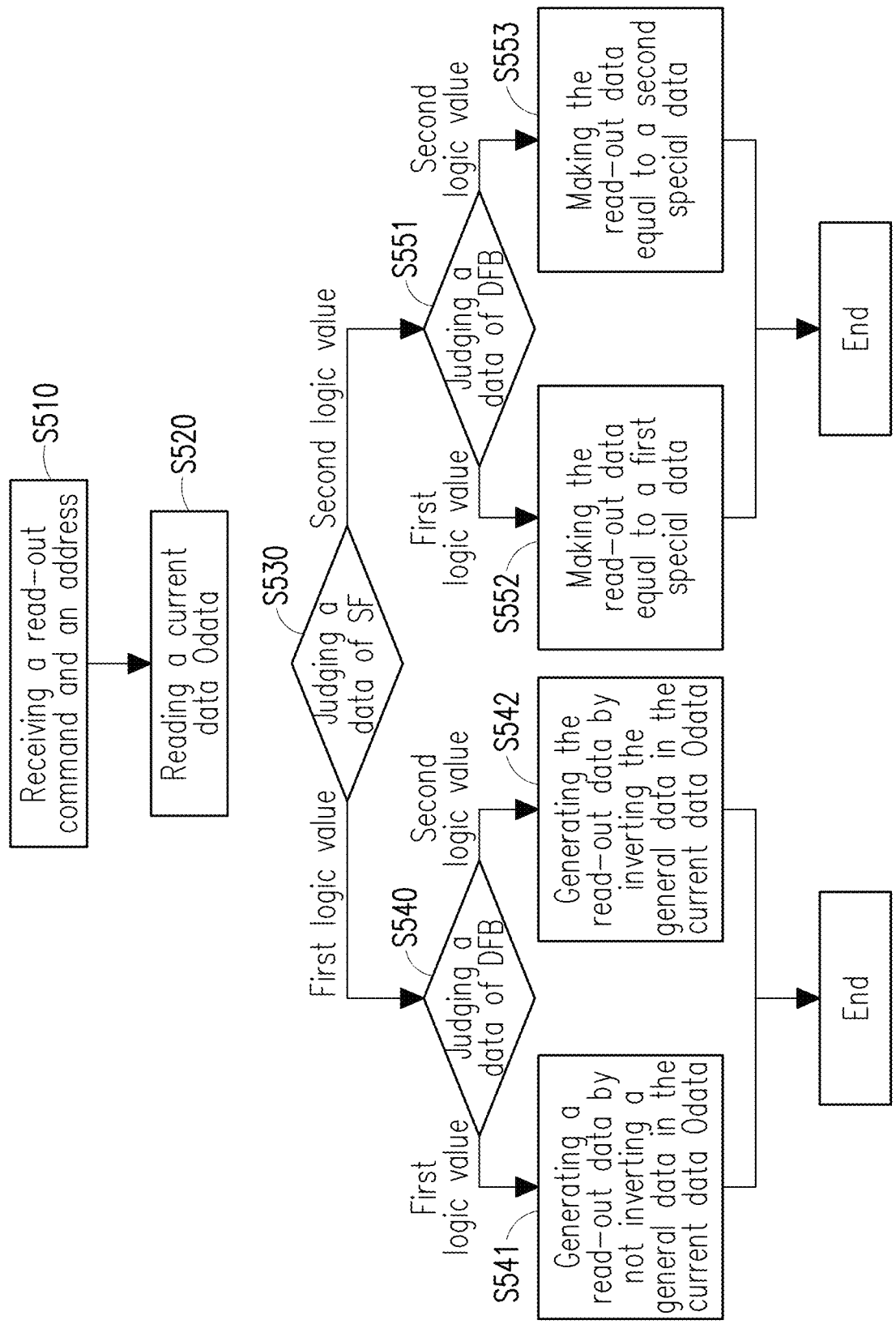

FIGS. 5A to 5C are flowcharts illustrating methods for reading data according to different embodiments of the invention. After being written into the selected memory cells according to the embodiment of FIG. 2A, the write-in data may be read according to the method of FIG. 5A. After being written into the selected memory cells according to the embodiment of FIG. 2B, the write-in data may be read according to the method of FIG. 5B. After being written into the selected memory cells according to the embodiment of FIG. 2C, the write-in data may be read according to the method of FIG. 5C.

With reference to FIG. 5A, first, in step S510, a read command is received and an address is received. Then, the current data Odata in the selected memory cells is read (step S520), and a data of the data inverting flag DFB therein is determined (step S540). Here, when the data inverting flag DFB has the first logic value (0), step S541 is performed. Otherwise, when the data inverting flag DFB has the second logic value (1), step S542 is performed.

In step S541, a read-out data is directly generated by not performing an inversion action on the general data in the current data Odata. On the other hand, in step S542, the read-out data is generated by performing the inversion action on the general data in the current data Odata. It is worth noting that, in the embodiment where the current data Odata includes the error correction code, before the read-out data is generated by step S541 or step S542, an ECC operation may be performed according to the error correction code to generate an error-corrected read-out data.

The embodiment of FIG. 5B is similar to the embodiment of FIG. 5A but different in that, the current data Odata includes the special data flag SF in this embodiment. Accordingly, in this embodiment, steps S530 to S531 for determining whether the current data Odata is the special data is further included before step S540. For conciseness, only steps S530 to S531 are described, whereas the rest of step are not repeated hereinafter.

With reference to FIG. 5B, in step S530, a data of the special data flag SF in the current data Odata is determined. Here, when the special data flag SF has the first logic value (0), step S540 is performed. Otherwise, when the special data flag SF has the second logic value (1), step S531 is performed. In step S531, because the special data flag SF has the second logic value (1), the read-out data may directly be made equal to the special data (e.g., by making the read-out data equal to #FF in hexadecimal), and a reading action is ended.

With reference to FIG. 5C, as compared to FIG. 5B, when the special data flag SF is determined as the second logic value (1) in step S530, step S551 is further performed to determine the data of the data inverting flag DFB. When the data inverting flag DFB is determined as the first logic value (0) in step S551, step S552 is performed to make the read-out data equal to the first special data (e.g., #FF in hexadecimal). On the other hand, when the data inverting flag DFB is determined as the second logic value (1) in step S551, step S553 is performed to make the read-out data equal to the second special data (e.g., #00 in hexadecimal).

Figure 6:
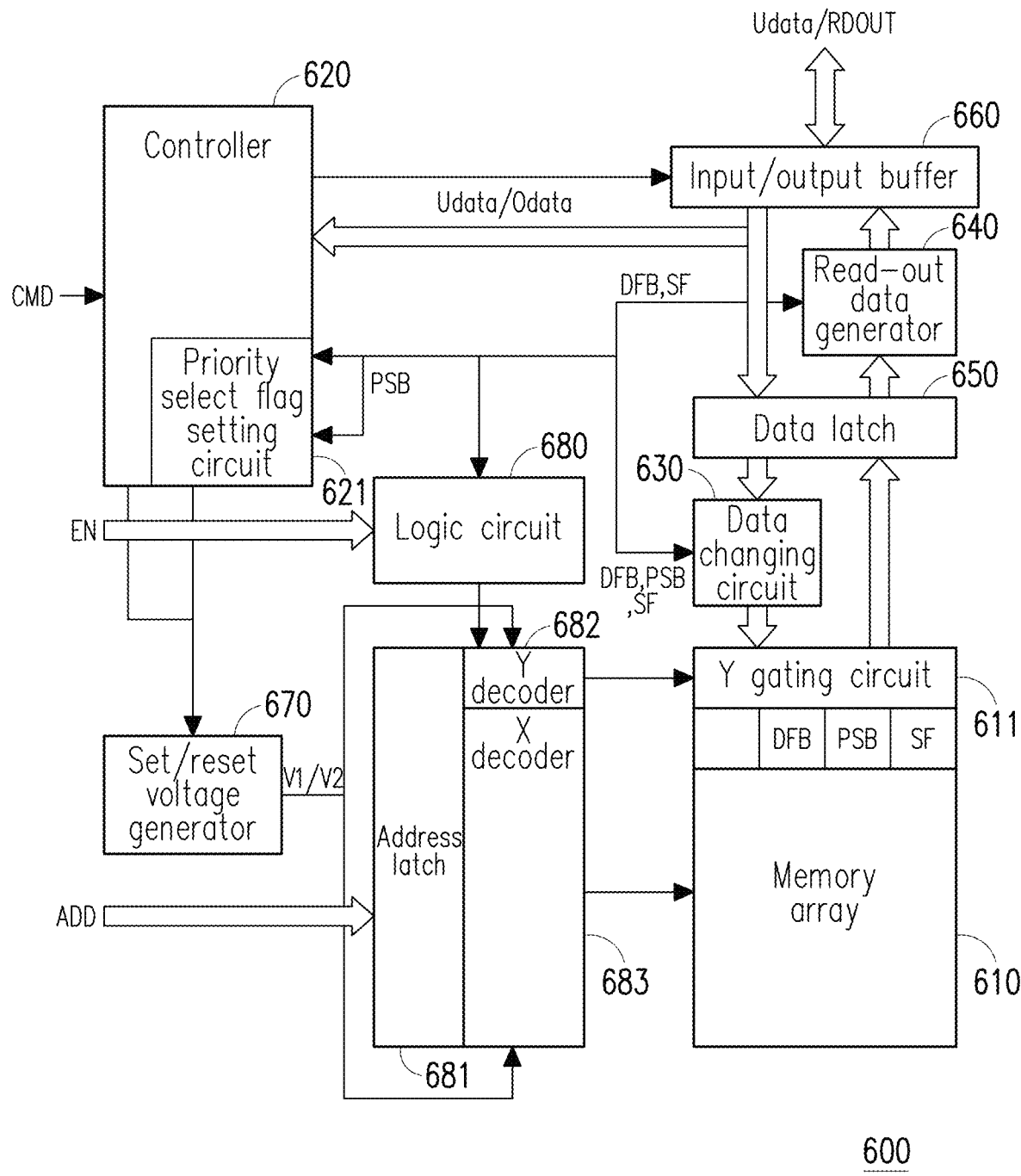
FIG. 6 is a schematic diagram illustrating a resistive memory in an embodiment of the invention.

With reference to FIG. 6, FIG. 6 illustrates a schematic diagram of a resistive memory in an embodiment of the invention. A resistive memory 600 includes a memory cell array 610, a controller 620, a data changing circuit 630, a read-out data generator 640, a data latch 650, an input/output buffer 660, a set/reset voltage generator 670, a logic circuit 680, an address latch 681, a Y decoder 682, an X decoder 683 and a Y gating circuit 611. The input/output buffer 660 is configured to receive the write-in data Udata or output a read-out data RDOUT. The input/output buffer 660 is coupled to the read-out data generator 640, the controller 620 and the data latch 650. The read-out data generator 640 can receive a data read by the data latch 650, and determine whether to generate the read-out data RDOUT by inverting the received data according to the data inverting flag DFB. The read-out data RDOUT may serve as the current data Odata to be transmitted to the controller 620. In addition, the write-in data Udata may be transmitted to the controller 620. In the embodiment where the special data flag SF is included, the read-out data 640 can also determine whether to directly use the special data as the read-out data RDOUT according to the special data flag.

The controller 620 includes a priority select flag setting circuit 621. The priority select flag setting circuit 621 is configured to set the state of the priority select flag PSB. The controller 620 may also be used to set the states of the data inverting flag DFB and the special data flag SF, and transmit the states of the priority select flag PSB, the data inverting flag DFB and the special data flag SF to the data changing circuit 630.

The data changing circuit 630 can generate the final data according to the states of the priority select flag PSB, the data inverting flag DFB and the special data flag SF, and write the final data into the selected memory cells of the memory cell array 610 via the Y gating circuit 611.

On the other hand, the address latch 681 receives an address ADD, and performs a decoding action on the address ADD through the Y decoder 682 and the X decoder 683 to select the selected memory cells in the memory cell array 610 for an access action. The logic circuit 680 receives an enable signal EN, and enables an internal action of the resistive memory 600 according to the enable signal EN.

In this embodiment, the memory cells may be grouped according to a fixed number. For example, a group of 1 byte, a group of 2 bytes or a group of 1 word may be set without particular limitation. Also, each group of the memory cells may correspond to one data inverting flag DFB and one priority select flag PSB. In other embodiments, each group of the memory cells may correspond to at least one special data flag SF. Further, in other embodiments, data in each group of the memory cells can include the data correction code.

The resistive memory 600 may further include an error correction circuit (not illustrated), which can be used to calculate the data correction code or perform a correction action on the read-out data according to the received data correction code in the embodiment where the error correction circuit is included.

It is worth noting that, the set/reset voltage generator 670 is coupled to the controller 620 and the address latch 681. After the controller 620 determines that the resistive memory 600 is in the process of performing the data writing action, when performing the reset procedure, the set/reset voltage generator 670 can adjust the reset voltage according to the priority select flag PSB to provide a reset pulse signal having a first voltage V1 or a second voltage V2, which may be used to perform a reset operation on the resistive memory 600. The relevant action details will be described further in the embodiment of FIG. 10.

It should be noted that, an action of the set/reset voltage generator 670 for adjusting a reset voltage, an action for setting the priority select flag PSB, the data inverting flag DFB and the special data flag SF performed by the controller 620 and an action for generating final write-in data may be performed simultaneously or separately without any particular limitation.

Figure 7:
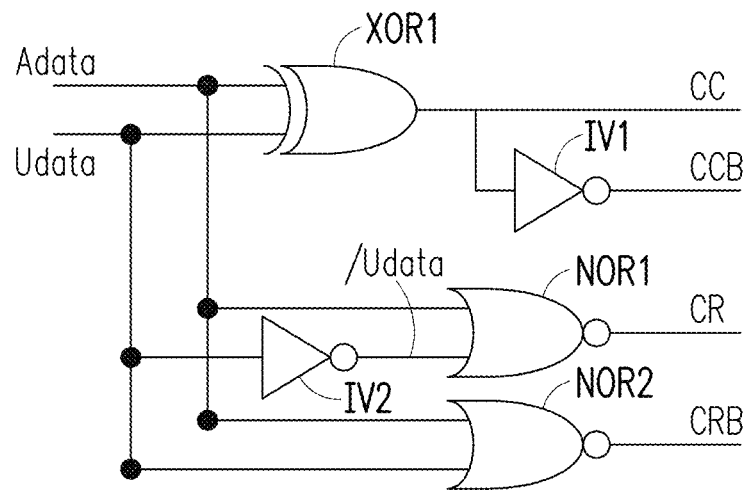
FIG. 7 is a schematic diagram of a circuit that performs a comparison action in the resistive memory in an embodiment of the invention.

With reference to FIG. 7, FIG. 7 is a schematic diagram of a circuit that performs a comparison action in the resistive memory in an embodiment of the invention. A comparison circuit 700 may be disposed in a controller, and may include an XOR gate XOR1, NOR gates NOR1 and NOR2 and inverters IV1 and IV2. The XOR gate XOR1 and the inverter IV1 are configured to perform an action of comparing a general data Adata in the current data Odata with the write-in data Udata in the temporary data Tdata and the inverted write-in data /Udata in the inverted temporary data /Tdata bit by bit, and generate a changed bit count CC of the general data Adata with respect to the write-in data Udata and the inverted write-in data /Udata and an inverted signal CCB. The NOR gate NOR2 performs an NOR logic operation on the write-in data Udata and the general data Adata and the NOR gate NOR1 performs an NOR logic operation on the inversion of the write-in data Udata and the general data Adata so as to respectively generate a reset bit count CR and an inverted signal CRB thereof.

Figure 8A:
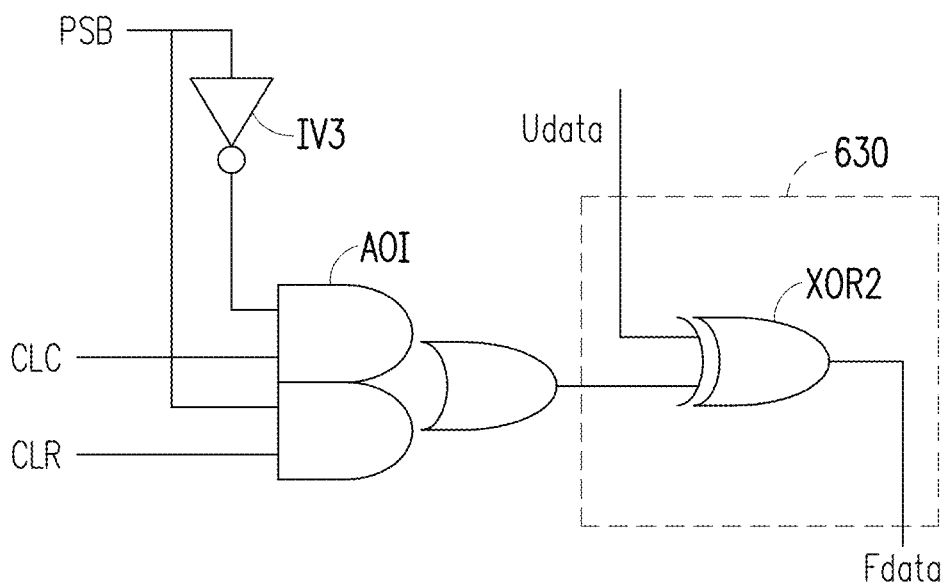
FIG. 8A and FIG. 8B are schematic diagrams respectively illustrating data changing circuits in different embodiments of the invention.
Figure 8B:
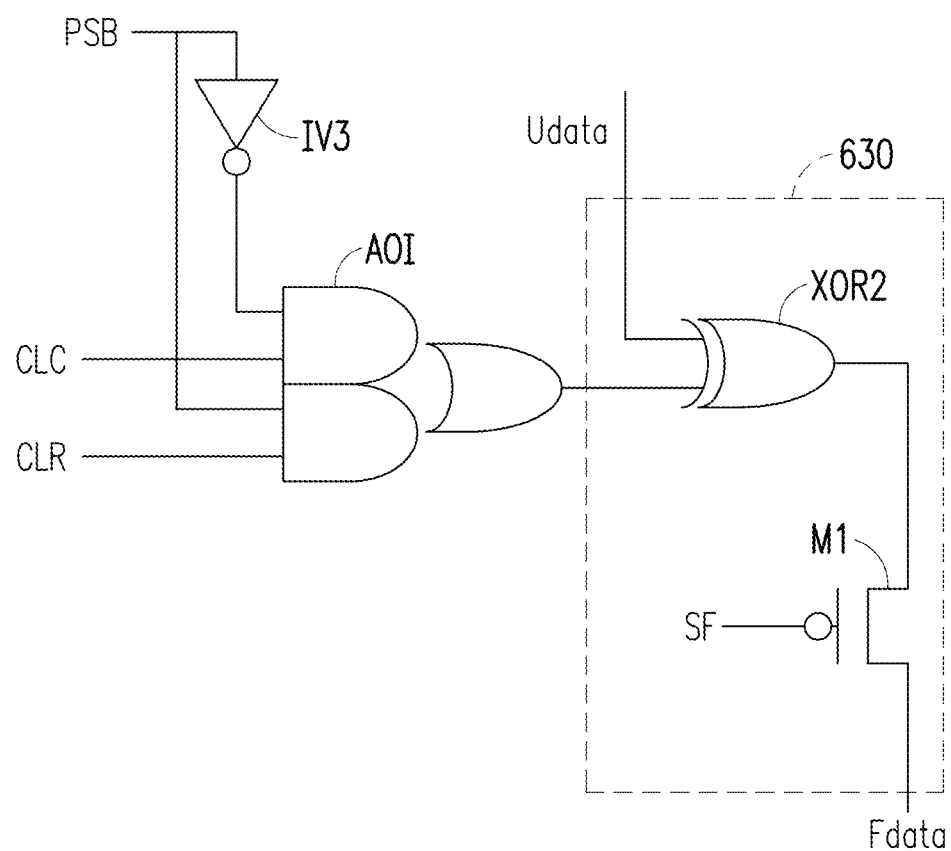

FIGS. 8A to 8B are schematic diagrams respectively illustrating data changing circuits in different embodiments of the invention. With reference to FIG. 8A, the data changing circuit 630 is coupled to a selector AOI. The selector AOI selects one of a change less bit mode signal CLC and a reset less bit mode signal CLR to be output according to the priority select flag PSB. The data changing circuit 630 includes an XOR gate XOR2. The XOR gate XOR2 receives the write-in data Udata and an output signal of the selector AOI, and determines whether to generate the final data Fdata by performing an XOR (exclusive or) operation on the write-in data Udata according to the output signal of the selector AOI.

With reference to FIG. 8B, as compared to the embodiment of FIG. 8A, the data changing circuit 630 further includes a transistor M1 in the embodiment where the current data Odata includes the special data flag SF. The transistor M1 is controlled by the special data flag SF. When the special data flag SF is equal to a logic value 1, the transistor M1 is cut off and does not generate the final data Fdata (i.e., does not change the general data Adata in the current data Odata). On the other hand, when the special data flag SF is equal to a logic value 0, the transistor M1 is turned on and an output of the XOR gate XOR2 may become the final data Fdata.

Figure 9A:
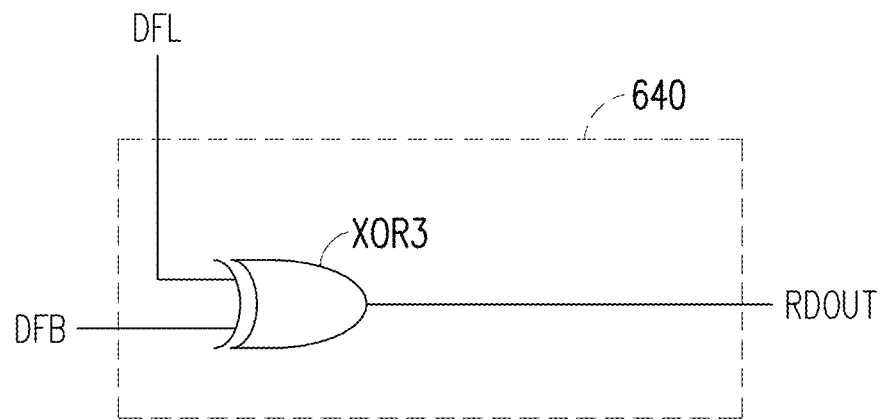
FIG. 9A and FIG. 9B are schematic diagrams respectively illustrating read-out data generators in different embodiments of the invention.
Figure 9B:
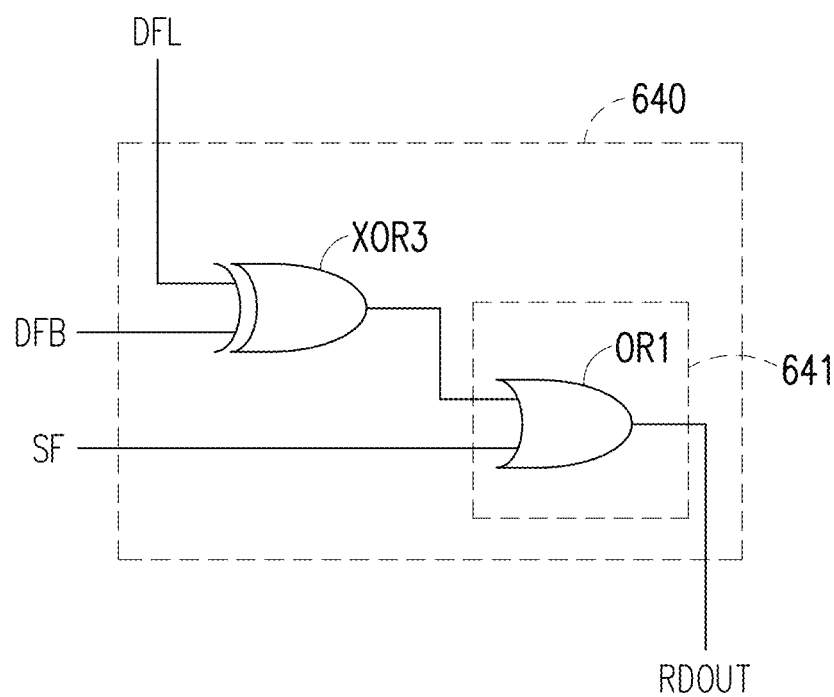

FIGS. 9A to 9B are schematic diagrams respectively illustrating read-out data generators in the embodiments of the invention. With reference to FIG. 9A, the read-out data generator 640 includes an XOR gate XOR3. The XOR gate XOR3 receives a data DFL from the data latch 650. The XOR gate XOR3 also receives the data inverting flag DFB, and determines whether to inverse the data DFL to be output as the read-out data RDOUT according to the data inverting flag DFB.

With reference to FIG. 9B, as compared to the embodiment of FIG. 9A, the read-out data generator 640 further includes a special data generating circuit 641 in the embodiment where the current data Odata includes the special data flag SF. The special data generating circuit 641 receives an output signal of the XOR gate XOR3, and determines whether to generate the read-out data RDOUT based on the data DFL according to the special data flag SF. In the example where the special data is #FF in hexadecimal, the special data generating circuit 641 of the present embodiment may include an OR gate OR. The OR gate OR1 receives an output signal of the XOR gate XOR3, and determines whether to generate the read-out data RDOUT based on the data DFL according to the special data flag SF. When the special data flag SF is equal to 1, the read-out data generator 640 forcibly generates the read-out data RDOUT equal to 1. On the other hand, when the special data flag SF is equal to 0, the read-out data generator 640 generates the read-out data RDOUT equal to the data DFL (when the data inverting flag DFB is equal to 0), or generates the read-out data RDOUT inverted to the data DFL (when the data inverting flag DFB is equal to 1). It should be noted that, although the circuit of the present embodiment is exemplified by #FF in hexadecimal as an example, the invention is not limited thereto. Based on different special data, persons skilled in the art may also design a desired circuit for generating the special data according to the special data flag SF.

Figure 10:
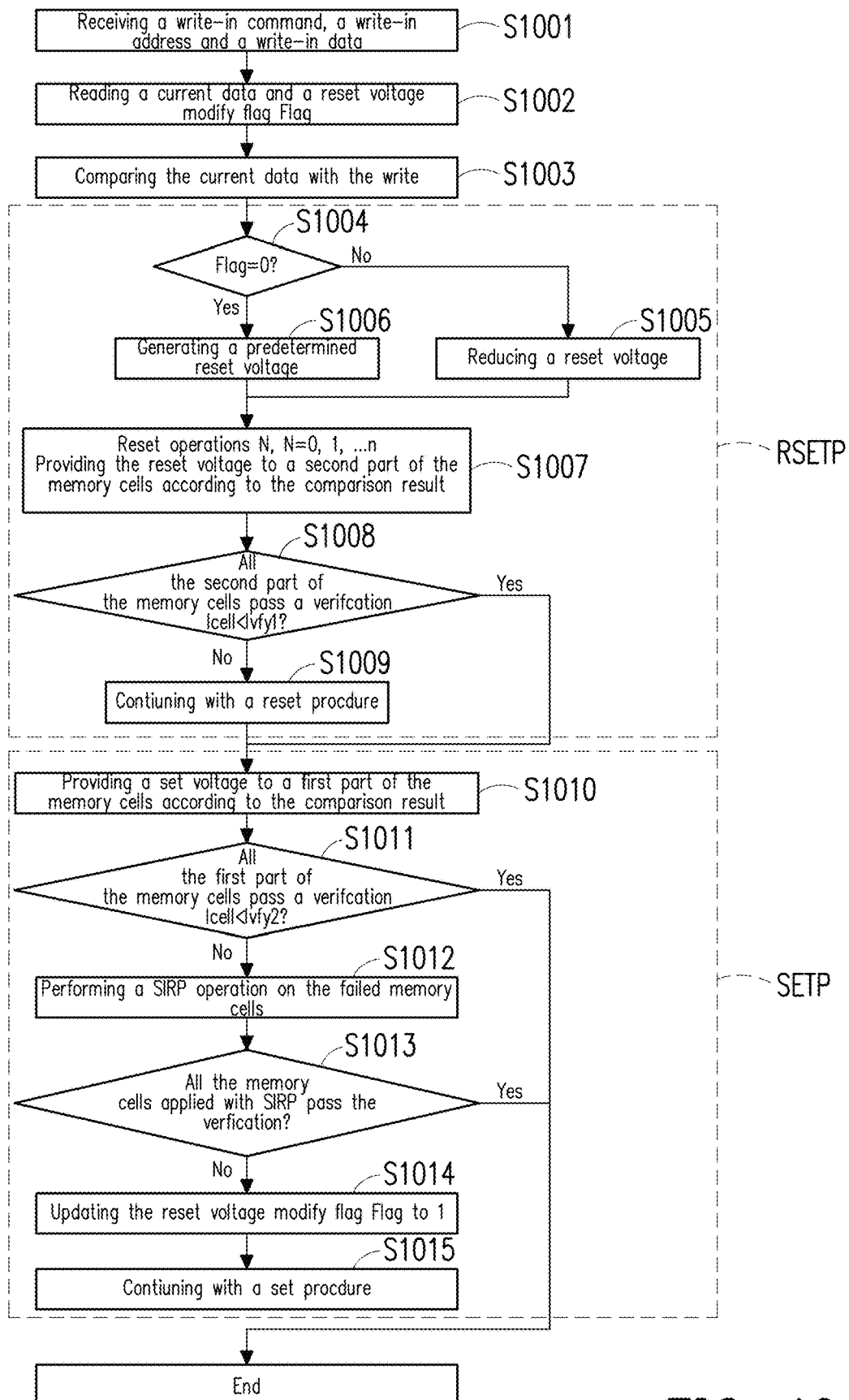
FIG. 10 is a schematic diagram illustrating a method for adjusting a reset voltage in an embodiment of the invention.

With reference to FIG. 10, FIG. 10 is a schematic diagram illustrating a method for writing data in an embodiment of the invention. FIG. 10 includes a reset process RSETP and a set process SETP. According to the flowchart of FIG. 10, in step S1001, a write-in command is received and a write-in address and a write-in data are received. In step S1002, a current data at the write-in address and a reset voltage modify flag Flag are read from a memory cell array. In an embodiment, an initial value of the reset voltage modify flag Flag is set to 0. In another embodiment, the priority select flag PSB may be used as the reset voltage modify flag.

Then, in step S1003, the current data is compared with the write-in data to determine whether a set operation or a reset operation needs to be performed on each memory cell corresponding to the write-in address. In an embodiment, the current data may also be compared with the write-in data and an inverted write-in data respectively in step S1003, and whether the set operation or the reset operation needs to be performed on each memory cell corresponding to the write-in address may be determined according to the priority select flag PSB.

Next, the reset process RSETP is performed on the memory cells that need to be changed to data 1 according to a comparison result. First, in step S1004, whether the reset voltage modify flag Flag is 0 is determined. If the reset voltage modify flag Flag is 0, a reset voltage is set according to a size of a preset voltage value (step S1006). Otherwise, if the reset voltage modify flag Flag is not 0, a size of a voltage value of the reset voltage is updated to a lower voltage (step S1005).

Then, in step S1007, the reset voltage is applied to a second part of memory cells that need to be changed to data 1 according to the comparison result to perform the reset operation once or multiple times, and then whether all the reset memory cells are successfully reset is verified. In this embodiment, whether the memory cells are successfully reset may be verified by a verification regarding whether a current Icell of the reset memory cells is less than a preset threshold Ivfy1. In step S1008, whether all the reset second part of memory cells pass the verification is determined. When a result of above determination is yes, the method proceeds to the set process SETP. Otherwise, if the result of above determination is no, step S1009 is performed to continue a predetermined reset procedure on the memory cell that fail the verification until all the second part of memory cells pass the verification, or until there are still the memory cells determined as failing the verification when the predetermined reset procedure is over.

After the reset process RSETP is over, the set process SETP is performed on a first part of memory cells that need to be changed to data 0 according to the comparison result. In step S1010, a set voltage is applied to the first part of memory cells that need to be changed to data 0 according to the comparison result to perform the set operation and whether all the set memory cells are successfully set. In this embodiment, whether the memory cells are successfully set may be verified by a verification regarding whether the current Icell of the set memory cells is greater than a preset threshold Ivfy2. In an embodiment, the preset threshold Ivfy2 may be to 25 µA, 30 µA, 35 µA or any suitable value.

Next, in step S1011, whether all the set first part of memory cells pass the verification is determined. When a result of above determination is yes, the data writing process is ended. Otherwise, if the result of above determination is no, step S1012 is performed.

In step S1012, a recover operation is performed on the memory cells that fail the verification, and then whether all the memory cells that fail the verification are successfully set is determined again. Specifically, the recover operation may be performed by applying an inversed set voltage (SIRP) to the memory cell that fail the verification. In this embodiment, the inversed set voltage is a voltage with phase opposite to that of the set voltage, and an absolute value of a voltage size thereof is approximately ⅓ to ¾ of an absolute value of the reset voltage.

Next, in step S1013, whether all the recovered memory cells pass the verification is determined. When a result of above determination is yes, the data writing process is ended. Otherwise, if the result of above determination is no, step S1014 is performed.

In step S1014, the reset voltage modify flag Flag is updated to 1, and a predetermined set procedure is performed on the memory cells that fail the recovery operation (step S1015) until all the first part of memory cells pass the verification, or until there are still the memory cells determined as failing the verification when the predetermined set procedure is over.

It should be noted that, in this embodiment, the write process SETP is performed after the reset process RSETP is performed. However, the invention is not limited in this regard. In the method for writing data provided by the invention, the reset process RSETP may also be performed after the set process SETP is performed.

In summary, according to the method for writing data of the resistive memory in the embodiments of the invention, by indicating a writing manner for the write-in data with use of the priority select flag to reduce the number of the memory cells actually being written in the process of writing data, the power consumption may be reduced and the cycling endurance of the memory cell may be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for writing data of a resistive memory, comprising:
   receiving a write-in data and generating an inverted write-in data;
   reading a current data in a plurality of selected memory cells;
   comparing the current data with the write-in data and the inverted write-in data;
   selecting the write-in data or the inverted write-in data to generate a final data according to a comparison result;
   generating the final data by setting a special data flag to a third logic value when the write-in data is a first special data or a second special data or when the resistive memory receives an erase command; and
   writing the final data into the selected memory cells.

2. The method for writing data according to claim 1, further comprising:
   setting a data inverting flag to a first logic value when the write-in data is selected as the final data; and
   selecting the data inverting flag to a second logic value when the inverted write-in data is selected as the final data.

3. The method for writing data according to claim 2, comprising:
   generating the final data by setting the data inverting flag to the first logic value and setting a special data flag to a third logic value when the write-in data is a first special data; and
   generating the final data by setting the data inverting flag to the second logic value and setting the special data flag to the third logic value when the write-in data is a second special data.

4. The method for writing data according to claim 3, comprising:

making a corresponding read-out data to be the first special data when the special data flag is the third logic value and the data inverting flag is the first logic value; and
   making the corresponding read-out data to be the second special data when the special data flag is the third logic value and the data inverting flag is the second logic value.

5. The method for writing data according to claim 2, wherein the step of comparing the current data with the write-in data and the inverted write-in data comprises:
   comparing the current data with the write-in data and the inverted write-in data according to a mode corresponding to a priority select flag.

6. The method for writing data according to claim 5, wherein the step of comparing the current data with the write-in data and the inverted write-in data according to the mode corresponding to the priority select flag comprises:
   correspondingly selecting a change less mode for comparing the current data with the write-in data and the inverted write-in data when the priority select flag is a fourth logic value; and
   correspondingly selecting a reset less mode for comparing the current data with the write-in data and the inverted write-in data when the priority select flag is a fifth logic value.

7. The method for writing data according to claim 6, wherein the step of writing the final data into the selected memory cells comprises:
   performing a set procedure on at least one of second part of selected memory cells among the selected memory cells.

8. The method for writing data according to claim 7, wherein the set procedure comprises:
   performing a set operation on at least one of the second part of selected memory cells according to a set voltage; and
   performing a recover operation on at least one of the failed second part of selected memory cells according to an inverted set voltage when the set operation is failed,
   wherein an absolute value of the set voltage is greater than an absolute value of the inverted set voltage.

9. The method for writing data according to claim 8, wherein the set procedure further comprises:
   verifying at least one of the second part of selected memory cells on which the recover operation is performed to obtain a verification result; and
   updating the priority select flag according to the verification result.

10. The method for writing data according to claim 9, wherein setting the priority select flag to the fourth logic value when the verification result is passed; and setting the priority select flag to the fifth logic value when the verification result is failed.

11. The method for writing data according to claim 5, wherein the step of writing the final data into the selected memory cells comprises:
    performing a reset procedure on at least one of first part of selected memory cells among the selected memory cells, wherein the reset procedure comprises:
       setting a reset voltage according to a reset voltage modify flag; and
       performing a reset operation on at least one of first part of selected memory cells among the selected memory cells according to the reset voltage, wherein the step of setting the reset voltage according to the reset voltage modify flag comprises:
making the reset voltage equal to a predetermined reset voltage when the reset voltage modify flag is a sixth logic value; and
making the reset voltage equal to an adjusted reset voltage when the reset voltage modify flag is a seventh logic value,
wherein a voltage absolute value of the predetermined reset voltage is greater than a voltage absolute value of the adjusted reset voltage.

12. The method for writing data according to claim 1, comprising:
making a corresponding read-out data to be the first special data when the special data flag is the third logic value.

13. A resistive memory, comprising:
a memory cell array;
a controller, coupled to the memory cell array, and configured for:
receiving a write-in data and generating an inverted write-in data;
reading a current data in a plurality of selected memory cells;
comparing the current data with the write-in data and the inverted write-in data in order to select the write-in data or the inverted write-in data to generate a final data;
generating the final data by setting a special data flag to a seventh logic value when the write-in data is a special data or the resistive memory receives an erase command; and
a data changing circuit, coupled to the controller and the memory cell array, the data changing circuit being configured to change the write-in data to the final data and write the final data into the selected resistive memory cells.

14. The resistive memory according to claim 13, wherein the controller is configured for:
setting a data inverting flag to a first logic value when the write-in data is selected as the final data; and
selecting the data inverting flag to a second logic value when the inverted write-in data is selected as the final data.

15. The resistive memory according to claim 14, wherein the controller is configured for:
comparing the current data with the write-in data and the inverted write-in data according to a mode corresponding to a priority select flag.

16. The resistive memory according to claim 15, wherein the controller comprises a priority select flag setting circuit, configured to set the priority select flag to a third logic value or a fourth logic value.

17. The resistive memory according to claim 16, wherein the controller is further configured for:
performing a reset procedure on at least one of first part of selected memory cells among the selected memory cells selected according to the final data,
wherein when performing the reset procedure, the controller is further configured for:
setting a reset voltage according to a reset voltage modify flag; and
performing a reset operation on the at least one of first part of selected memory cells according to the reset voltage, the resistive memory further comprises:
a set/reset voltage generator, coupled to the controller, and configured to provide a reset pulse voltage,
the set/reset voltage generator makes the reset voltage equal to a predetermined reset voltage when the reset voltage modify flag is a fifth logic value; and
the set/reset voltage generator makes the reset voltage equal to an adjusted reset voltage when the reset voltage modify flag is a sixth logic value,
wherein a voltage absolute value of the predetermined reset voltage is greater than a voltage absolute value of the adjusted reset voltage.

18. The resistive memory according to claim 16, wherein the controller is configured for:
performing a set procedure on at least one of second part of selected memory cells among the selected memory cells according to the final data.

19. The resistive memory according to claim 18, wherein when performing the set procedure, the controller is further configured for:
performing a set operation on at least one of the second part of selected memory cells according to a set voltage; and
performing a recover operation on at least one of the failed second part of selected memory cells according to an inverted set voltage when the set operation is failed,
wherein an absolute value of the set voltage is greater than an absolute value of the inverted set voltage.

20. The resistive memory according to claim 19, wherein the controller is configured for:
verifying at least one of the second part of selected memory cells on which the recover operation is performed to obtain a verification result; and
updating the priority select flag according to the verification result.

21. The resistive memory according to claim 20, wherein the controller sets the priority select flag to the third logic value when the verification result is passed, and the controller sets the priority select flag to the fourth logic value when the verification result is failed.

22. The resistive memory according to claim 20, further comprising:
a data latch, coupled to the memory cell array and the data changing circuit, and configured to latch the write-in data and the current data; and
a read-out data generator, generating a read-out data by performing an inverting action on the current data according to the data inverting flag.

23. The resistive memory according to claim 14, wherein the controller is further configured for:
generating the final data by setting a special data flag to a seventh logic value and setting the data inverting flag to the first logic value when the write-in data is a first special data;
generating the final data by setting the special data flag to the seventh logic value and setting the data inverting flag to the second logic value when the write-in data is a second special data.

24. The resistive memory according to claim 23, wherein the controller is further configured for:
making a read-out data to be the first special data when determining that the special data flag is the seventh logic value and the data inverting flag is the first logic value; and making the read-out data to be the second special data when determining that the special data flag is the seventh logic value and the data inverting flag is the second logic value.

25. The resistive memory according to claim 13, wherein the controller is further configured for:
   making a read-out data to be the first special data when determining that the special data flag is the seventh logic value.

* * * * *